(12) United States Patent
Novogran et al.

(10) Patent No.: US 11,093,382 B2
(45) Date of Patent: Aug. 17, 2021

(54) SYSTEM DATA COMPRESSION AND RECONSTRUCTION METHODS AND SYSTEMS

(71) Applicant: SK hynix Inc., Gyeonggi-do (KR)

(72) Inventors: Igor Novogran, Minsk (BY); Alexander Ivaniuk, Minsk (BY)

(73) Assignee: SK hynix Inc., Gyeonggi-do (KR)

( * ) Notice: Subject to any disclaimer, the term of this patent is extended or adjusted under 35 U.S.C. 154(b) by 95 days.

(21) Appl. No.: 16/255,365

(22) Filed: Jan. 23, 2019

(65) Prior Publication Data

US 2019/0227924 A1 Jul. 25, 2019

Related U.S. Application Data

(60) Provisional application No. 62/621,405, filed on Jan. 24, 2018.

(51) Int. Cl.
*G06F 12/02* (2006.01)
*G06F 3/06* (2006.01)
*H03M 7/30* (2006.01)

(52) U.S. Cl.
CPC .......... *G06F 12/0246* (2013.01); *G06F 3/061* (2013.01); *G06F 3/0608* (2013.01); *G06F 3/0638* (2013.01); *G06F 3/0641* (2013.01); *G06F 3/0679* (2013.01); *H03M 7/30* (2013.01); *G06F 2212/401* (2013.01)

(58) Field of Classification Search
CPC .. G06F 12/0246; G06F 3/0638; G06F 3/0679; G06F 3/061; G06F 3/0608; G06F 3/0641; G06F 2212/401; H03M 7/30
See application file for complete search history.

(56) References Cited

U.S. PATENT DOCUMENTS

| 7,529,880 B2 | 5/2009 | Chung et al. |
| 9,229,876 B2 | 1/2016 | Slepon |
| 2010/0023682 A1* | 1/2010 | Lee ..................... G06F 12/0246 711/103 |

(Continued)

FOREIGN PATENT DOCUMENTS

WO  WO 2017/112357  6/2017

OTHER PUBLICATIONS

Mittal et al., A Survey of Architectural Approaches for Data Compression in Cache and Main Memory Systems, IEEE Transactions on Parallel and Distributing Systems, Jun. 3, 2015, pp. 1-14.

(Continued)

*Primary Examiner* — Kalpit Parikh
(74) *Attorney, Agent, or Firm* — IP & T Group LLP

(57) ABSTRACT

Methods and systems are provided for compression and reconstruction of system data. A controller of a memory system includes a compression component for searching for a pattern of an array of system data including a plurality of elements and compressing the array of system data based on the pattern. The array of system data includes neighbor elements corresponding to a first pattern, among the plurality of elements. The compressed system data includes: first information including a first bit indicating a first content; and second information including a first bitmap, each bit of the first bitmap indicating whether a corresponding element is a first element among the neighbor elements of the first pattern.

20 Claims, 16 Drawing Sheets

(56) References Cited

U.S. PATENT DOCUMENTS

2014/0279953 A1* 9/2014 Aronovich .......... G06F 16/1752
707/692

OTHER PUBLICATIONS

Yang et al., Frequent value compression in data caches, Proceedings 33rd Annual IEEE/ACM International Symposium on Microarchitecture. MICRO-33 2000, Oct. 13, 2000, IEEE.

Pekhimenko et al., Base-Delta-Immediate Compression Practical Data Compression for On-Chip Caches, Sep. 19, 2012, pp. 1-12.

Chen et al., C-Pack: A High-Performance Microprocessor Cache Compression Algorithm, IEEE Transactions on Very Large Scale Integration (VLSI) Systems, vol. 18, No. 8, Aug. 2010, pp. 1196-1208.

* cited by examiner

FIG. 8A

| SDA | Element index | ... | i | i+1 | i+2 | i+3 | i+4 | i+5 | i+6 | i+7 | i+8 | i+9 | i+10 | i+11 | ... |
|---|---|---|---|---|---|---|---|---|---|---|---|---|---|---|---|
| | Element content | ... | $j_1$ | $j_2$ | 10 | 10 | 10 | 10 | 10 | 10 | 10 | 10 | $j_3$ | $j_4$ | ... |

SVP: BP=10, L=8 (covers i+2 through i+9)

FIG. 8B

| SDA | Element index | ... | i | i+1 | i+2 | i+3 | i+4 | i+5 | i+6 | i+7 | i+8 | i+9 | i+10 | i+11 | ... |
|---|---|---|---|---|---|---|---|---|---|---|---|---|---|---|---|
| | Element content | ... | $j_1$ | $j_2$ | 10 | 10 | 10 | 20 | 10 | 10 | 10 | 10 | $j_3$ | $j_4$ | ... |

SVP: BP=10, L=3 (i+2 to i+4); Pattern: BP=20, L=1 (i+5); SVP: BP=10, L=4 (i+6 to i+9); Split Pattern (SP)

FIG. 9A

| Main Bitmap Indices | i+2 | i+3 | i+4 | i+5 | i+6 | i+7 | i+8 | i+9 |
|---|---|---|---|---|---|---|---|---|
| Main Bitmap | 0 | 1 | 1 | 1 | 1 | 1 | 1 | 1 |

| | |
|---|---|
| Array of Bases | 10 |
| Auxiliary Bitmap | 1 |
| Array of Bases and auxiliary Bitmap Indices | k |

FIG. 9B

| Main Bitmap Indices | i+2 | i+3 | i+4 | i+5 | i+6 | i+7 | i+8 | i+9 |
|---|---|---|---|---|---|---|---|---|
| Main Bitmap | 0 | 1 | 1 | 0 | 1 | 1 | 1 | 1 |

| | | |
|---|---|---|
| Array of Bases | 10 | 20 |
| Auxiliary Bitmap | 1 | 0 |
| Array of Bases and auxiliary Bitmap Indices | k | k+1 |

FIG. 10A

| 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|
| Flag 1 | Flag 2 | Flag 3 | Flag 4 | Bit Field 1 | | | Bit Field 2 | | | | | Bit Field 3 | | | | | | | | | | Bit Field 4 | | | | | | | | | |

FIG. 10B

| 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|
| Flag 1 | Flag 2 | Flag 3 | Flag 4 | Bit Field 1 | | | Bit Field 2 | | | | | Bit Field 3 | | | | | | | | | | Bit Field 4.1 | | | | | Bit Field 4.2 | | | | |

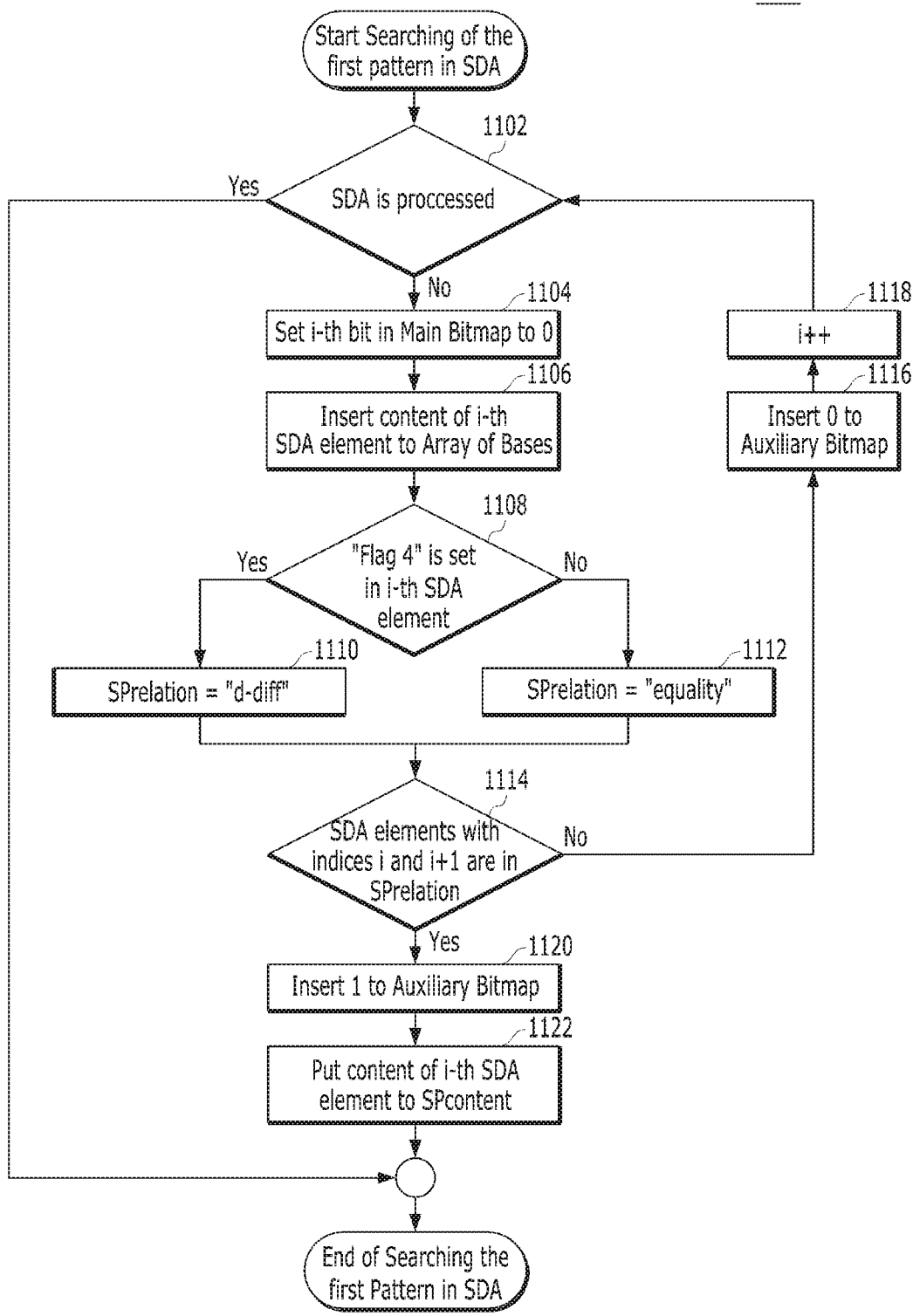

FIG. 14A

| 15 | 14 | 13 | 12 | 11 | 10 | 9 | 8 | 7 | 6 | 5 | 4 | 3 | 2 | 1 | 0 |
|----|----|----|----|----|----|---|---|---|---|---|---|---|---|---|---|
| Reserved | | UECC Bit | Valid Bit (is set) | Super Block Index | | | | Super Block Offset | | | | | | | |

FIG. 14B

| L2P Segment | Element index | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| | Element content | 0x1300 | 0x1301 | 0x1302 | 0x1303 | 0x1304 | 0x1305 | 0x1306 | 0x1307 | 0x1308 | 0x1309 | 0x130A | 0x130B | 0x130C | 0x130D | 0x130E | 0x130F |

FIG. 14C

| L2P Segment | Element index | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| | Element content | 0x1300 | 0x1301 | 0x1302 | 0x14F1 | 0x1409 | 0x1305 | 0x1306 | 0x1307 | 0x1308 | 0x1309 | 0x130A | 0x130B | 0x130C | 0x130D | 0x130E | 0x130F |

FIG. 15A

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| Reserved | | UECC Bit | Valid Bit (isn't set) | Super Block Index | | | | Erase Counter Value | | | | | | | |

FIG. 15B

| L2P Segment | Element index | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| | Element content | 0x1300 | 0x1301 | 0x1302 | 0x14F1 | 0x1409 | 0x1305 | 0x1306 | 0x1307 | 0x1308 | 0x0307 | 0x0307 | 0x130B | 0x130C | 0x130D | 0x130E | 0x130F |

FIG. 15C

| Main Bitmap indices | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| Main Bitmap | 0 | 1 | 1 | 0 | 0 | 1 | 1 | 1 | 1 | 0 | 1 | 0 | 1 | 1 | 1 | 1 |

| Compressed L2p Segment by Proposed algorithm | Array of Bases | 0x1300 | 0x14F1 | 0x1409 | 0x0307 | 0x130B |
|---|---|---|---|---|---|---|
| | Auxiliary Bitmap | 1 | 0 | 0 | 1 | 1 |
| Array of Bases and Auxiliary Bitmap indices | | 0 | 1 | 2 | 3 | 4 |

FIG. 16A

| L2P Segment | Element index | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| | Element content | 0x1000 | 0x1001 | 0x1002 | 0x1003 | 0x1004 | 0x1005 | 0x1006 | 0x1007 | 0x1008 | 0x1009 | 0x100A | 0x100B | 0x100C | 0x100D | 0x100E | 0x100F |

FIG. 16B

| Main Bitmap indices | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| Main Bitmap | 0 | 1 | 1 | 1 | 1 | 1 | 1 | 1 | 1 | 1 | 1 | 1 | 1 | 1 | 1 | 1 |

| Compressed L2P Segment by Proposed algorithm | Array of Bases | 0x1000 |
|---|---|---|
| | Auxiliary Bitmap | 1 |
| Array of Bases and Auxiliary Bitmap indices | | 0 |

SYSTEM DATA COMPRESSION AND RECONSTRUCTION METHODS AND SYSTEMS

CROSS-REFERENCE TO RELATED APPLICATION

This application claims the benefit of U.S. Provisional Application No. 62/621,405, filed on Jan. 24, 2018, the entire contents of which are incorporated herein by reference.

BACKGROUND

1. Field

Embodiments of the present disclosure relate to a scheme for processing system data for a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). Memory systems use various system data.

SUMMARY

Aspects of the present invention include system data compression and reconstruction methods and memory systems.

In one aspect, a memory system includes a memory device and a controller. The controller includes a compression component for searching for a pattern of an array of system data including a plurality of elements and compressing the array of system data based on the pattern. The controller controls the memory device to store the compressed system data in the memory device. The array of system data includes neighbor elements corresponding to a first pattern, among the plurality of elements. The compressed system data includes: first information including a first bit indicating a first content; and second information including a first bitmap, each bit of the first bitmap indicating whether a corresponding element is a first element among the neighbor elements of the first pattern.

In another aspect, a memory system includes a memory device for storing compressed system data including first and second information, and a controller. The controller loads the compressed system data, and reconstructs the loaded compressed system data based on the first and second information to generate an array of system data. The array of system data includes neighbor elements corresponding to a first pattern, among a plurality of elements. The first information includes a first bit indicating a first content. The second information includes a first bitmap, each bit of the first bitmap indicating whether a corresponding element is a first element among the neighbor elements of the first pattern.

In still another aspect, a method for operating a memory system including a memory device and a controller. The method includes: searching for a pattern of an array of system data including a plurality of elements; compressing the array of system data based on the pattern; and storing the compressed system data in the memory device. The array of system data includes neighbor elements corresponding to a first pattern, among the plurality of elements. The compressed system data includes: first information including a first bit indicating a first content; and second information including a first bitmap, each bit of the first bitmap indicating whether a corresponding element is a first element among the neighbor elements of the first pattern.

In still yet another aspect, a method for operating a memory system including a memory device and a controller. The method includes: loading compressed system data including first and second information from a memory device; and reconstructing the loaded compressed system data based on the first and second information to generate an array of system data. The array of system data includes neighbor elements corresponding to a first pattern, among a plurality of elements. The first information includes a first bit indicating the first content. The second information includes a first bitmap, each bit of the first bitmap indicating whether a corresponding element is a first element among the neighbor elements of the first pattern.

Additional aspects of the present invention will become apparent from the following description.

BRIEF DESCRIPTION OF THE DRAWINGS

FIGS. 8A and 8B are diagrams illustrating examples of an array of system data.

FIGS. 9A and 9B are diagrams illustrating examples of compressed system data in accordance with an embodiment of the present invention.

FIGS. 10A and 10B are diagrams illustrating a complex data structure of an array of system data.

FIG. 11 is a flowchart illustrating a pattern searching process of system data in accordance with an embodiment of the present invention.

FIGS. 14A to 14C are diagrams illustrating an example of a complex data structure of an array of system data.

FIGS. 15A and 15B are diagrams illustrating another example of a complex data structure of an array of system data.

FIG. 15C is a diagram illustrating an example of compressed system data in accordance with an embodiment of the present invention.

FIG. 16A is a diagram illustrating an example of a complex data structure of an array of system data.

FIG. 16B is a diagram illustrating an example of compressed system data in accordance with an embodiment of the present invention.

DETAILED DESCRIPTION

Figure 1:
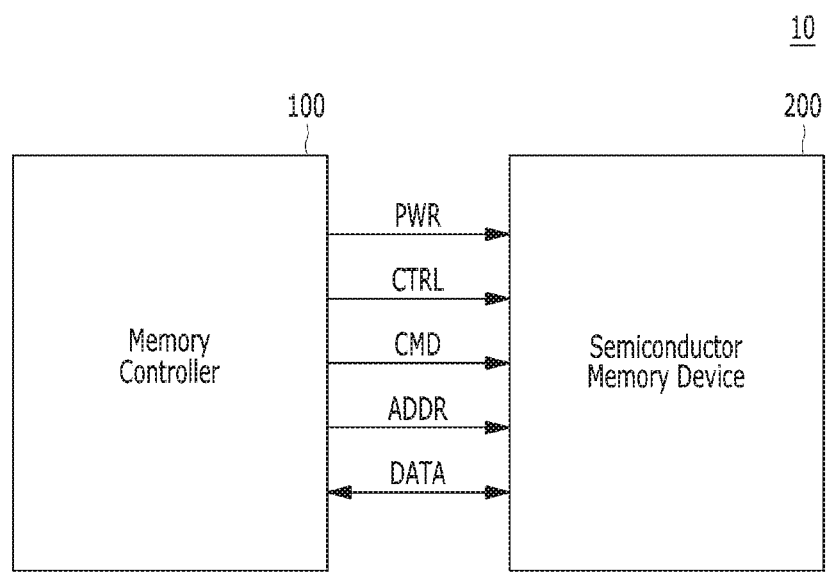
FIG. 1 is a block diagram illustrating a memory system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a memory system 10 in accordance with an embodiment of the present invention.

Referring FIG. 1, the memory system 10 may include a memory controller 100 and a semiconductor memory device 200, which may represent more than one such device. The semiconductor memory device(s) 200 may be flash memory device(s), particularly of the NAND-type.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output (I/O) lines. The semiconductor memory device 200 may receive power PWR through a power line and a control signal CTRL through a control line. The control signal CTRL may include a command latch enable (CLE) signal, an address latch enable (ALE) signal, a chip enable (CE) signal, a write enable (WE) signal, a read enable (RE) signal, and the like.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to form a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDRC), and/or a universal flash storage (UFS).

In another embodiment, the memory system 10 may be provided as one of various components in an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

Figure 2:
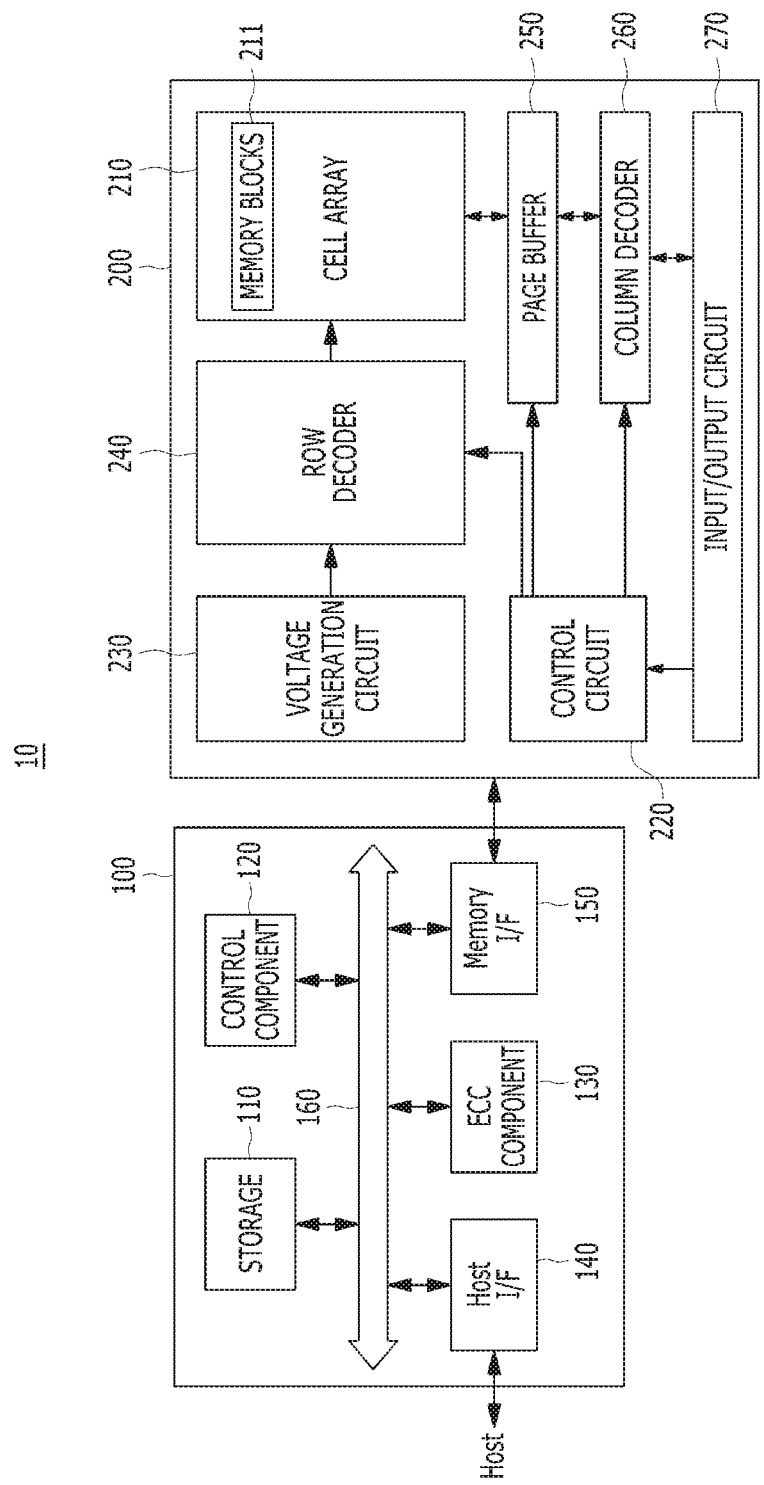
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, and/or a digital video recorder and a digital video player. In some embodiments, the host device may include a portable electronic device such as a mobile phone, a smart phone, an e-book, an MP3 player, a portable multimedia player (PMP), and/or a portable game player.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In some embodiments, the ECC component 130 may perform an error correction operation based on a coded modulation such as a low-density parity-check (LDDC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). As such, the ECC component 130 may include all circuits, systems or devices for suitable error correction operation.

The host interface 140 may communicate with the host device through one or more of various interface protocols such as a universal serial bus (USB), a ti-media card (MMC), a peripheral component interconnect express (PCI-e), a small computer system interface (SCSI), a serial-attached SCSI (SAS), a serial advanced technology attachment (SATA), a parallel advanced technology attachment (DATA), an enhanced small disk interface (ESDI), an integrated drive electronics (IDE), and non-volatile memory express (NVMe).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, which may be in the form of an array of page buffers, a column decoder 260, and an input/output circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks.

Figure 3:
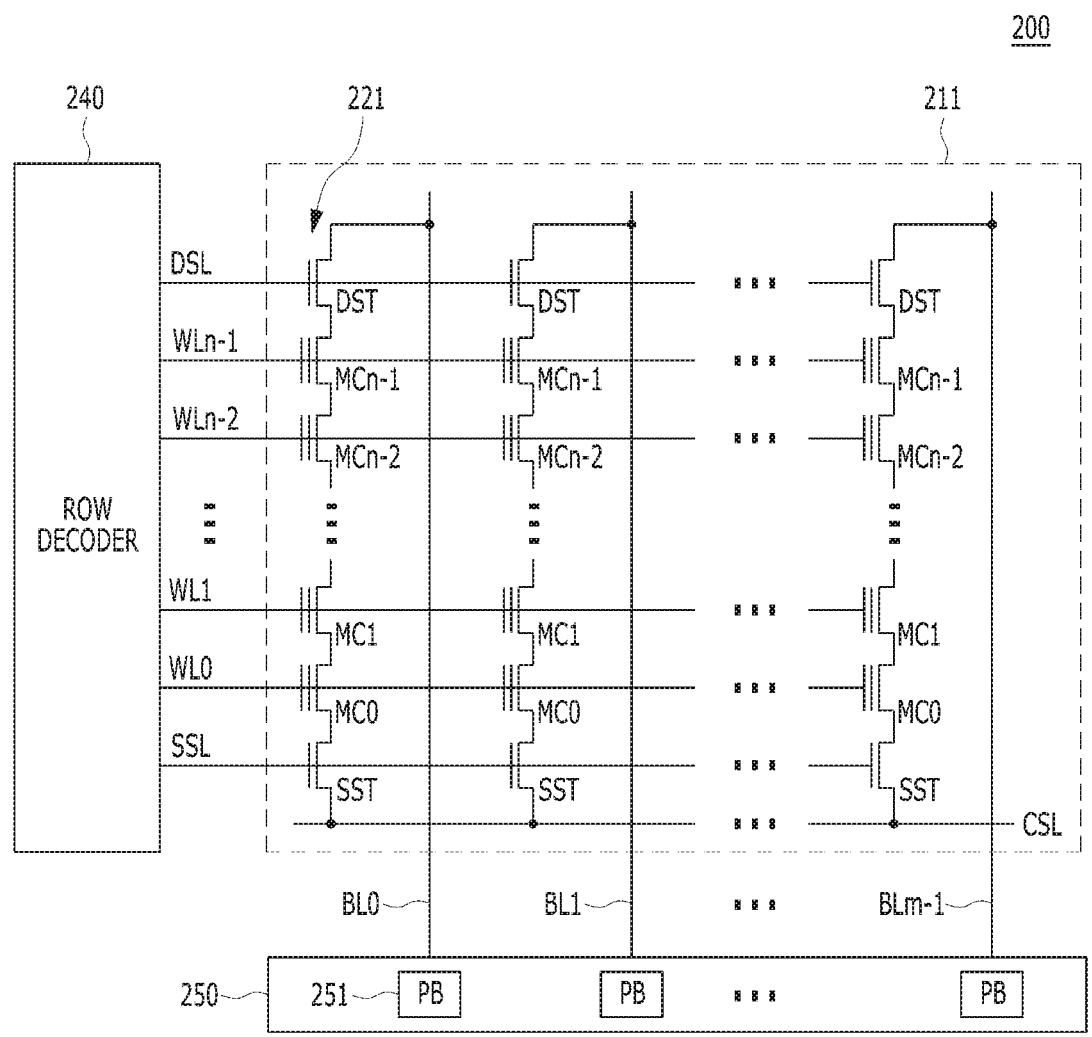
FIG. 3 is a circuit diagram illustrating a memory block of a memory device of a memory system in accordance with an embodiment of the present invention.

The page buffer 250 may be in electrical communication with the memory cell array 210 through bit lines BL (shown in FIG. 3). The page buffer 250 may pre-charge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or exchange data with the input/output circuit 270.

The input/output circuit 270 may transmit to the control circuit 220 a command and an address, received from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 200 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm-1. The page buffers 251 may operate in response to page buffer control signals. For example, the page buffers 251 my temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4A:
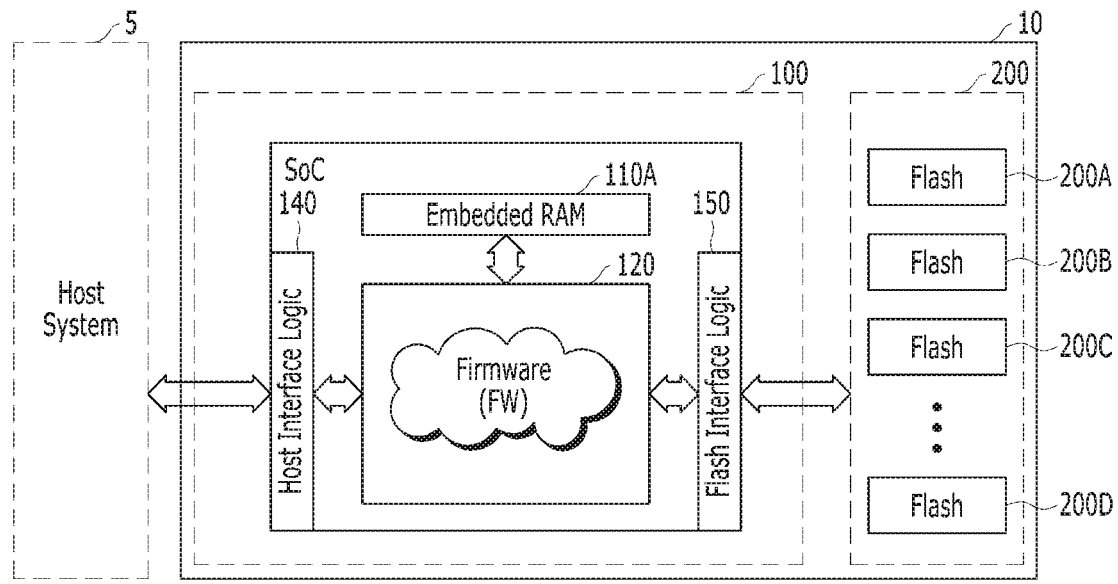
FIGS. 4A and 4B are diagrams illustrating a data processing system in accordance with an embodiment of the present invention.
Figure 4B:
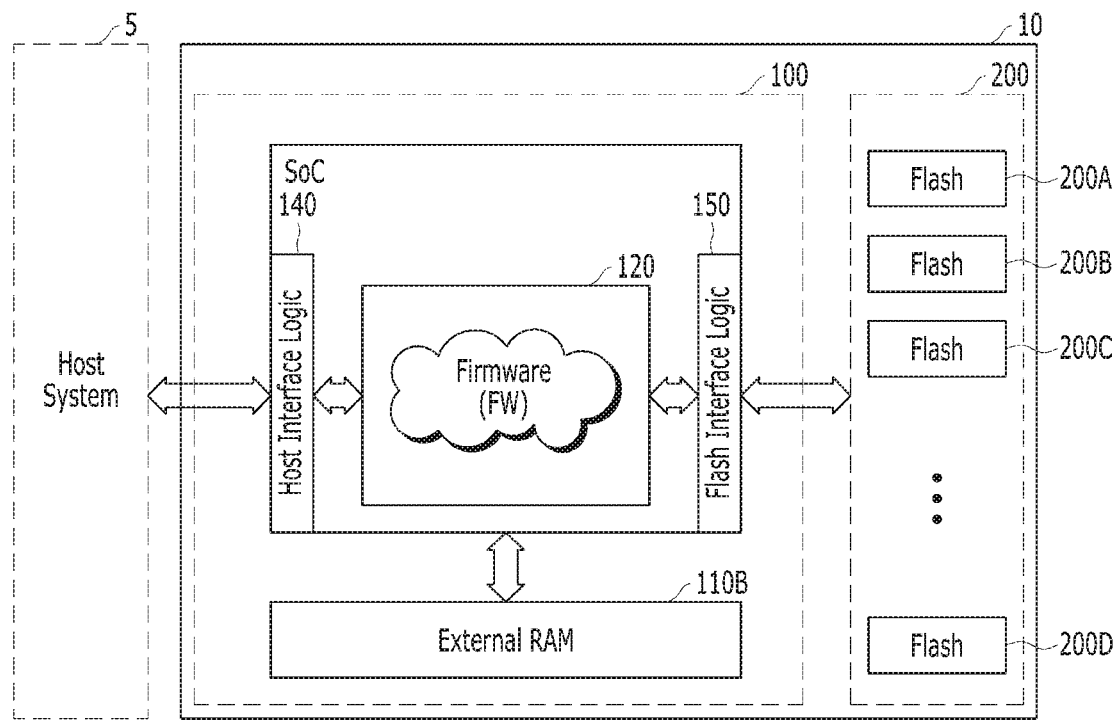

FIGS. 4A and 4B are diagrams illustrating a data processing system in accordance with an embodiment of the present invention.

Referring to FIG. 4A, the data processing system may include a host system 5 and a memory system 10. The memory system 10 may include a controller 100 and a memory device 200. In various embodiments, the memory system 10 may be a flash-based storage device such as a memory card of a universal flash storage (UFS), and a solid state drive (SSD).

The memory device 200 may include a plurality of flash chips 200A to 200D. The controller 100 may include a storage 110A, a control component 120, a host interface logic 140 and a flash interface logic 150. The storage 110A, the control component 120, the host interface logic 140 and the flash interface logic 150 may be implemented with system-on-chip (SoC). The storage 110A may be implemented with an embedded random access memory (RAM). The control component 120 may be implemented with a microprocessor (μP). The control component 120 may include firmware (FW), which is usually running thereon. Further, the controller 100 may include other elements, which are illustrated in FIG. 2 but not illustrated in FIGS. 4A and 4B. The storage 110A, the control component 120, the host interface logic 140 and the flash interface logic 150 may be implemented on system-on-chip (SoC).

Referring to FIG. 4B, the data processing system may include a host system 5 and a memory system 10. As shown in FIG. 4A, the memory system 10 may include a controller 100 and a memory device 200.

The controller 100 may include a storage 110B a control component 120, host interface logic 140 and flash interface logic 150. The control component 120, the host interface logic 140 and the flash interface logic 150 may be implemented on system-on-chip (SoC). The storage 110E may be implemented by an external random access memory (RAM). The control component 120 may be implemented with a microprocessor (μP). The control component 120 may include firmware (FW), which is usually running thereon. Further, the controller 100 may other include elements, which are illustrated in FIG. 2 but not illustrated in FIGS. 4A and 4B.

In FIGS. 4A and 4B, one of the functions of the FW is to satisfy requests from the host system 5 (i.e., Host requests) by turning them into internal flash operations. The FW takes reads and writes on logical blocks and turns them into low-level read, program, and erase commands on the physical blocks and physical pages of the memory device 200. Also, the FW should prevent reliability issues within flash chips of the memory device 200, e.g., a limited number of erase-program cycles and read/write disturbance.

To provide the required functionality of the flash-based storage device 10, the FW executes specific internal procedures. Also, the FW has to generate some specific internal data, e.g., system data (SD). For example, the system data may include a set of counters (e.g., erase and read counters)

to control physical state of the flash chips during device lifetime, and address translation tables to manage physical access to stored data in the flash chips. Therefore, the system data may be represented as a set of entities, where each entity is used by the FW for a specific required function.

The FW logs system data into the flash chips itself, to reconstruct correct device state after power off. At the same time, to provide a high-level performance of flash-based flash device, the FW has to cache the system data in available RAM 110A or 110B. Preferably, the highest performance may be achieved if all system data can be stored in the RAM 110A or 110B. Due to hardware overhead constraints and/or very large capacity of flash chips, it is not always possible to use the RAM 110A or 110B with the corresponding capacity. Therefore, the FW has to load the system data from the flash chips periodically, which significantly drops device performance. In order to store more entities of the system data in the RAM 110A or 110B, the system data may be losslessly compressed. In this case, performance may be improved by reducing the number of internal accesses to the flash chips.

There are many data compression algorithms for memory systems. They differ in objectives of implementation and depend on the type of data to be compressed. For example, appropriate compression algorithms may be used for the system performance improvement, energy saving, storage capacity increase, miss rate and bandwidth reduction: Sparsh Mittal, Jeffrey S. Vetter: A Survey of Architectural Approaches for Data Compression in Cache and Main Memory Systems. IEEE Trans. Parallel Distrib. Syst. 27(5): 1524-1536 (2016). Also, the nature of system data determines which compression algorithm is best suited for the implementation. For instance, if system data contains few distinct values which frequently occur, frequent value compression (FVC) algorithm is best to be used: J. Yang, Y. Zhang and R. Gupta "Frequent value compression in data caches", in Proc. Annu. IEEE/ACM Int, Symp. Microarchit., 2000, pp. 258-265. In the case when the difference between the elements of SD entities is very small, some types of base-delta or pattern-based compression algorithms may be applied: G. Pekhimenko, V. Seshadri, O. Mutlu, P. B. Gibbons, M. A. Kozuch, and T. C. Mowry, "Base-delta-immediate compression: practical data compression for on-chip caches", in PACT, 2012, pp. 377-388; and X. Chen, L. Yang, R. P. Dick, L. Shang, and H. Lekatsas, "C-pack: A high-performance microprocessor cache compression algorithm", IEEE Transactions on VLSI Systems, vol. 18, no. 8, pp. 1196-1208, 2010.

In various embodiments, an adjustable compression scheme for system data of memory systems such as NAND flash-based storage devices is provided. The compression scheme may take into account the variable difference between compressed data elements. The compression scheme may reduce of the number of internal FW accesses to flash chips by reducing the size of system data and allows entire system performance boosting. Without limiting general applicability, a system data entity may be considered as an array of some binary structures or an array of system data (SDA).

In various embodiments, the state of the SDA elements depends not only on the internal FW management algorithms but also on the sequences of commands from a host system (i.e., Host commands). If the behavior of the host system has some regularity (e.g., sequential read/write), this regularity may be observed in SDA elements. For example, the host system rewrites entire capacity of a memory device sequentially, an erase counters table contains values which are very close to each other. In other words, a difference between any two elements is not greater than a threshold value (e.g., 1). If the behavior of the host system is random, it is hard to identify regularity between SDA elements. For example, if the host system uses the entire capacity of the memory device for random read, a read counter table contains random integer values.

Therefore, some patterns may be observed in SDA elements, where a pattern is a linear subset of SDA elements which are in some relations to their neighbor elements. For example, if there is a linear subset of SDA elements, where each element contains the same value, this linear subset forms same value pattern (SVP) and the relation between the neighbor elements is equality.

In various embodiments, a base of a pattern (BP) is defined as a content of the first element in the linear subset of SDA elements, which form a certain pattern. A binary content of any element from the pattern may be obtained using its BP and the predefined relation between the elements.

Figure 5:
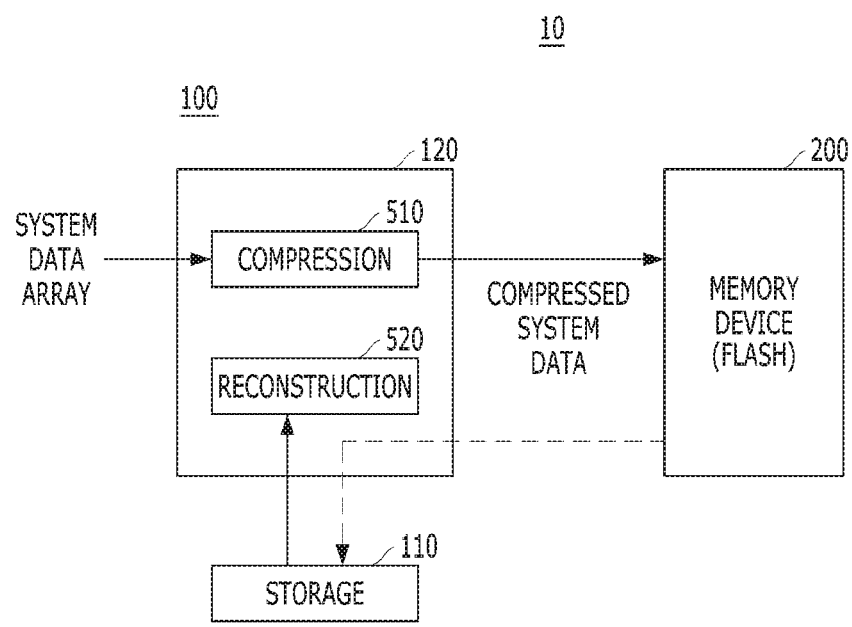
FIG. 5 is a diagram illustrating a memory system in accordance with an embodiment of the present invention.

FIG. 5 is a diagram illustrating a memory system in accordance with an embodiment of the present invention, for example, the memory system 10 of FIGS. 1, 2, 4A and 4B.

Referring to FIG. 5, the memory system 10 may include a controller 100 and a memory device 200. In various embodiments, the memory system 10 may be a flash-based storage device such as a memory card of a universal flash storage (UFS), and a solid state drive (SSD). The memory device 200 may include a plurality of flash chips 200A to 200D as shown in FIGS. 4A and 4B, which may be NAND type flash chips.

The controller 100 may include a storage 110 and a control component 120. The control component 120 may include a compression component 510 and a reconstruction component 520. The control component 120 may be implemented with a microprocessor (μP). The control component 120 may include firmware (FW), which is usually running on thereon. Further, the controller 100 may include other elements, which are illustrated in FIG. 2 but not illustrated in FIG. 5.

The control component 120 may receive an array of system data from the host system 5 through the host interface logic 140 of FIGS. 4A and 4B. The control component 120 may compress the array of system data to generate compressed system data, using the compression component 510. The array of system data may include a plurality of elements. The control component 120 may transmit the compressed system data to the memory device 200 through the flash interface logic 150 of FIGS. 4A and 4B. The memory device 200 may store the compressed system data in a certain memory region.

The control component 120 may load the stored compressed system data from the memory device 200. Further, the control component 120 may store the loaded compressed system data in the storage 110. The storage 110 may be the embedded RAM 110A or the external RAM 110E as shown in FIGS. 4A and 4B.

The compression component 510 may receive the array of system data, search for a pattern of the array of system data and compress the array of system data based on the searched pattern.

In various embodiments, the array of system data includes neighbor elements corresponding to a first pattern, among the plurality of elements. The neighbor elements include a first content in common.

In various embodiments, the compressed system data includes first information and second information The first information includes a first bit indicating the first content. The second information includes a first bitmap. Each bit of the first bitmap indicates whether a corresponding element is a first element among the neighbor elements of the first pattern.

In various embodiments, all of the neighbor elements have the first content equally. Alternatively, a first element of the neighbor elements has the first content and a second element of the neighbor elements has a second content different from that of the first content, the second element adjacent being to the first element.

In various embodiments, the compressed system data further includes third information including a second bitmap. A first bit of the second bitmap indicates a length of the first pattern.

In various embodiments, the array of system data includes at least one other element having a second pattern. The other element has a second content different from the first content. The other element is interposed between two adjacent elements among the neighbor elements. The first information further includes a second bit indicating the second content. A second bit of the second bitmap indicates a length of the second pattern.

The reconstruction component 520 may reconstruct the loaded compressed system data. In various embodiments, the reconstruction component 520 may reconstruct the loaded compressed system data based on the first and second information.

Figure 6:
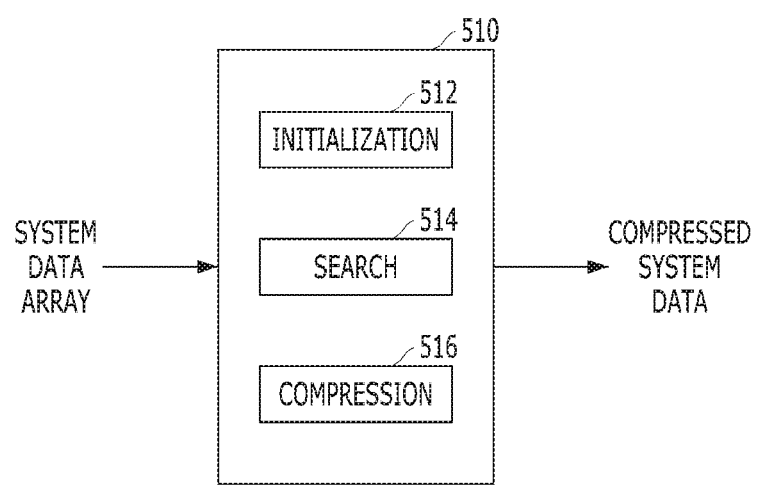
FIG. 6 is a diagram illustrating a compression component in accordance with an embodiment of the present invention.

FIG. 6 is a diagram illustrating a compression component in accordance with an embodiment of the present invention, for example, the compression component 510 of FIG. 5.

Referring to FIG. 6, the compression component 510 may receive an array of system data from the host system 5 through the host interface logic 140 of FIGS. 4A and 4B. The compression component 510 may compress the array of system data to generate compressed system data.

The compression component 510 may include an initialization component 512, a search component 514 and a compression component 516. The initialization component 512 may perform an initialization process for a compression scheme in accordance with embodiments of the present invention. The search component 514 may perform a search process for searching a pattern of the array of system data. The compression component 516 may perform a compression process for compressing the array of system data based on the searched pattern. The initialization process, the search process and the compression process will be described in below.

Figure 7A:
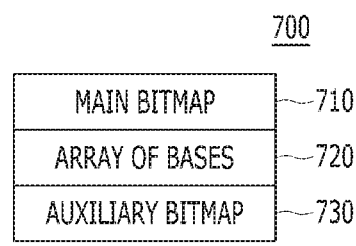
FIGS. 7A and 7B are diagrams illustrating compressed system data in accordance with an embodiment of the present invention.
Figure 7B:
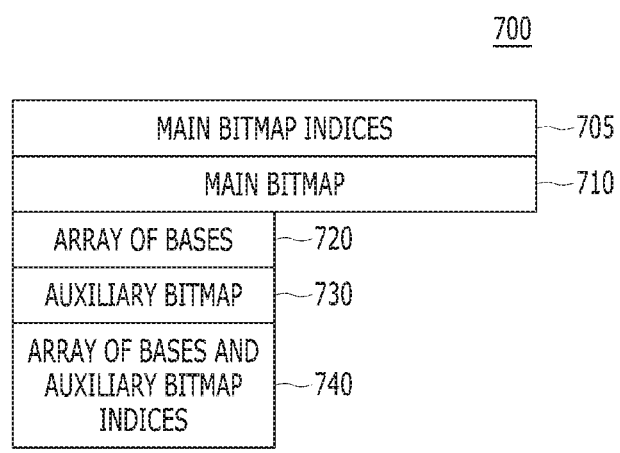

FIGS. 7A and 7B are diagrams illustrating compressed system data 700 in accordance with an embodiment of the present invention.

Referring to FIG. 7A, the compressed system data 700 may include first information 720, second information 710 and third information 730. The second information 710 may include main bitmap. The first information 720 may include array of bases. The third information 730 may include auxiliary bitmap.

Referring to FIG. 7B, it is illustrated that the compressed system data 700 may further include fourth information 705 and fifth information 740. The fourth information 705 may include main bitmap indices. The fifth information 740 may include array of bases and auxiliary bitmap indices. It is noted that the fourth information 705 and the fifth information 740, i.e., indices have been added just to simplify understanding of the compression algorithm itself and better visualization. In other words, indices may not be included and stored in the compressed system data 700.

Information 710 to 740 included in the compressed system data 700 will be described in below.

FIGS. 8A and 8B are diagrams illustrating examples of an array of system data (SDA).

Referring to FIG. 8A, the array of system data may include a plurality of elements and a plurality of element indices i to (i+11). Elements corresponding to element indices i and (i+1) have a content "j1". Elements corresponding to element indices (i+10) and (i+11) have a content "j3" and "j4", respectively. Elements corresponding to element indices (i+2) to (i+9) each has a content "10". In other words, the plurality of elements includes neighbor elements corresponding to element indices (i+2) to (i+9), which form a first pattern. The neighbor elements include a first content "10" in common. The first pattern may be defined as a same value pattern (SVP).

The pattern (i.e., SVP) of FIG. 8A has elements, each of which has a predefined relation with its neighbor elements. The pattern may be represented as two values: BP=10 and the length of the pattern L=8. This representation may require fewer storage (e.g., RAM) resources than storing the whole pattern.

FIGS. 9A and 9B are diagrams illustrating examples of compressed system data in accordance with an embodiment of the present invention. The compressed system data of FIG. 9A may correspond to the array of system data (i.e., SVP) of FIG. 8A, and the compressed system data (i.e., two SVPs or single SP) of FIG. 9B may correspond to the array of system data of FIG. 8B. The compressed system data of FIGS. 9A and 9B may be generated by the compression component 510 of FIGS. 5 and 6.

Referring to FIG. 9A, the compressed system data may include array of bases as first information, main bitmap as second information, auxiliary bitmap as third information, main bitmap indices as fourth information, and array of bases and auxiliary bitmap indices as fifth information. The first information (i.e., array of bases) may include a value "10" of content of elements corresponding to indices (i+2) to (i+9) in FIG. 8A.

The second information (i.e., main bitmap) may include multiple bits, each of which indicates whether a corresponding element is a first element among elements included in the pattern SVP. The number of multiple bits of the main bitmap may correspond to the number of elements included in the pattern SVP. First bit of the second information may include a bit having a value of "0", which indicates whether a corresponding element is a first element among elements included in the pattern SVP. The remaining bits of the second information may have a value of "1", which indicates whether a corresponding element is not the first element among elements included in the pattern SVP.

The third information (i.e., auxiliary bitmap) may include at least one bit, which indicates a length of the pattern SVP. The auxiliary bitmap has one or more bits based on the number of the pattern SVP included in the array of system data. Since the number of the pattern SVP is 1, the auxiliary bitmap has one bit. The bit of the auxiliary bitmap has a value indicating whether the pattern SVP has an element or more elements. Since the pattern SVP has 8 elements corresponding to the length L=8, the bit of the auxiliary bitmap has a value "1".

The fourth information (i.e., main bitmap indices) may include bits corresponding to bits of the main bitmap indicating index (i+2) to index (i+9). In other words, each of the main bitmap indices may correspond to each of the elements include in the pattern SVP. The fifth information (i.e., array of bases and auxiliary bitmap indices) may include one or more bits, which indicate array of bases and auxiliary bitmap indices. Since the number of array of bases and auxiliary bitmap indices is 1, the fifth information includes the value of index k.

Referring back to FIG. 8B, the array of system data may include a plurality of elements and a plurality of element indices i to (i+11). Elements corresponding to element indices i and (i+1) have a content "j1". Elements corresponding to element indices (i+10) and (i+11) have a content "j3" and "j4", respectively. Elements corresponding to element indices (i+2) to (i+4) and (i+6) to (i+9) have a content "10". Element corresponding to element index (i+5) has a content "20", In other words, the plurality of elements includes neighbor elements corresponding to element indices (i+2) to (i+4), which form a first pattern, neighbor elements corresponding to element indices (i+6) to (i+9), which form a second pattern, and element corresponding to element index (i+5), which form a third pattern. The neighbor elements corresponding to element indices (i+2) to (i+4) and (i+6) to (i+9) include a first content "10" in common. The first and second patterns may be defined as a same value patterns (SVPs), which can be interposed as a single split pattern (SP). The third pattern may be interposed between the first pattern and the second pattern and may be defined as a pattern with length 1.

Referring back to FIGS. 4A and 4B, during processing of a command from a host system 5, the control component 120 changes the binary content of element with index (i+5) to some other binary content. For example, as shown in FIG. 8B, the control component 120 changes the content of the element with index (i+5) from 10 to 20.

In FIG. 8B, the element with index (i+5) does not have equal relation with neighbor elements, hence it can be interpreted as pattern with length 1. Thus, this change splits initial SVP of FIG. 8A into two SVPs (which can be interposed as a single split pattern (SP)) including first SVP having elements from index (i+2) to (i+4) and second SVP having elements from index (i+6) to (i+9), which have the same BP=10. In other words, the element with index (i+5) does not have a predefined relation with its neighbors, as a pattern with length equals 1. Such element may be represented as two values: BP=20 which is equal to element content and L=1.

Referring to FIG. 9B, the compressed system data may include array of bases as first information, main bitmap as second information, auxiliary bitmap as third information, main bitmap indices as fourth information, and array of bases and auxiliary bitmap indices as fifth information. The first information (i.e., array of bases) may include a value "10" of content of elements corresponding to indices (i+2) to (i+4) and (i+6) to (i+9) in FIG. 8A, and a value "20" of content of elements corresponding to index (i+5) in FIG. 8A.

The second information (i.e., main bitmap) may include multiple bits. Each of the multiple bits indicates whether a corresponding element is a first element among elements included in the SP or pattern with length 1. The number of multiple bits of the main bitmap may correspond to the number of elements included in the SP or pattern with length 1. First bit of the second information may include a bit having a value of "0", which indicates whether a corresponding element is a first element among elements included in the SP. Second and third bits of the second information may have a value of "1", which indicates whether a corresponding element is not the first element among elements included in the SP. Fourth bit of the second information may include a bit having a value of "0", which indicates whether a corresponding element is a first element among elements included in the pattern with length 1. Bits from 5 to 8 of the second information may have a value of "1", which indicates whether a corresponding element is not the first element among elements included in the SP.

The third information (i.e., auxiliary bitmap) may include bits, which indicates the case when a length of a pattern is greater than 1. The auxiliary bitmap has one or more bits based on the number of the pattern included in the array of system data. Since the number of the pattern SP is 1, the auxiliary bitmap has one bit. Since the number of the pattern with length 1 is 1, the auxiliary bitmap has another bit. The first bit of the auxiliary bitmap has a value indicating whether the pattern SP has an element or more elements. Since the pattern SP has 7 elements corresponding to the length L=7 which greater than 1, the first bit of the auxiliary bitmap has a value "1". Since the pattern with length 1 has 1 element corresponding to the length L=1, the second bit of the auxiliary bitmap has a value "0".

The fourth information (i.e., main bitmap indices) may include bits corresponding to bits of the main bitmap indicating index (i+2) to index (i+9). In other words, each of the main bitmap indices may correspond to each of the elements include in the pattern SP or pattern with length 1. The fifth information (i.e., array of bases and auxiliary bitmap indices) may include one or more bits, which indicate array of bases and auxiliary bitmap indices. Since the number of array of bases and auxiliary bitmap indices is 1, the fifth information includes the value of index k and another value of index (k+1).

As described in FIG. 9B, the compression scheme allows reconstructing the relation between the split parts of the initial pattern SVP. This allows storing only one BP instead of all BPs for each of the split parts of the initial SVP pattern. The compressed data has three data structures: 2 bitmaps including main bitmap and auxiliary bitmap, and 1 array of bases.

The array of bases includes all BPs for each pattern including BP of the pattern with L=1. The size of the main bitmap is equal to the number of elements in the SDA. Each element has its own bit in the main bitmap. If the bit is set as "1", the corresponding element belongs to some pattern. If the bit is not set, i.e., if the bit is set as "0", the corresponding element is the first element in the new pattern.

Only elements which are the BPs of a new pattern have a corresponding bit in the auxiliary bitmap. If the bit is set as "1", the length of a pattern is greater than a threshold value (i.e., 1). If the bit is not set, i.e., if the bit is set as "0", the length of a pattern is equal to the threshold value.

The auxiliary bitmap allows storing only one BP of the initial pattern instead of all BPs, even if the initial pattern has been split into several parts by patterns with L=1. A content of any compressed SDA element may be easily reconstructed without full decompression from array of bases and two mentioned bitmaps.

Referring back to FIG. 5, in order to provide a particular functionality, the control component 120 (i.e., FW) may use a specific SDA. For example, the control component 120 uses an erase counters table to manage a number of erase-program cycles for a physical block. In this example, all bits of an element of the mentioned SDA are interpreted by the control component 120 as an integer number.

However, in another example, an element of a specific SDA may be a complex data structure including 32-bits element, as shown in FIGS. 10A and 10B. In FIGS. 10A and 10B, the complex data structure may include bit fields including bit 0 to bit 27 and control bits (or flags) including bit 28 to bit 31. The bit fields may include Bit Field 1 including bit 25 to bit 27, Bit Field 2 including bit 20 to bit 24, Bit Field 3 including bit 11 to bit 19 and Bit Field 4 including bit 0 to bit 10. The control bits may include bit 28 (i.e., Flag 4), bit 29 (i.e., Flag 3), bit 30 (i.e., Flag 2) and bit 31 (i.e., Flag 1).

Moreover, the content interpretation of SDA by the FW may depend on the state of its control bits, which are managed by the FW according to its internal algorithms. For example, if "Flag 4" is not set, the FW interprets bits from 0 to 10 as a single bit field ("Bit Field 4"), as shown in FIG. 10A. If "Flag 4" is set, the FW interprets bits from 0 to 10 as two separate bit fields, i.e., "Bit Field 4.1" bits from 6 to 10 and "Bit Field 4.2" bits from 0 to 5), as shown in FIG. 10B.

Due to a complex structure of SDA, possible observed patterns in specific SDA may be defined by FW engineers taking into account the behavior of the host system and the features of FW algorithm.

As described above, if SDA has the structure of FIG. 10A or FIG. 10B, the following observed patterns such as same value pattern (SVP) and delta value pattern (DVP) are possible. The SVP may occur in the SDA only if "Flag 4" is not set, as shown in FIG. 10A. The relation between elements of the SVP may be defined as "equality" (see FIG. 8A). The DVP may occur in the SDA only if "Flag 4" is set, as shown in FIG. 10B. It means the difference between two neighbor elements of the SDA is constant and known (defined as d). The relation between elements of the DVP may be defined as "d-diff" (see FIG. 8B).

Referring back to FIG. 6, the compression scheme for the SDA may include three steps including the initialization process by the initialization component 512, the searching process by the search component 514, and the compression process by the compression component 516. In the compression scheme, variable "SPcontent" is used to store a content of SDA elements of SP, variable "i" is used for iteration through the SDA elements, variable "SPrelation" is used to store the type of relations ("equality" or "d-diff") between the elements of SP.

The initialization process may be performed by steps as shown in the following list:

---
a. Set all bits in the Main Bitmap to zero, the size of the Main Bitmap equals to the number of elements in the SDA for compression.
b. The Array of Bases must be empty.
c. The Auxiliary Bitmap must be empty.
d. Set variable i to zero.
---

FIG. 11 is a flowchart illustrating a pattern searching process 1100 of system data in accordance with an embodiment of the present invention. The searching process 1100 may be performed by the search component 514 of the compression component 510 in FIG. 6. The searching process 1100 may be performed where L>1. If there are no patterns with L>1, the compression algorithm is not able to operate and the algorithm stops.

Referring to FIG. 11, at step 1102, it is determined whether an array of system data (SDA) is processed. When it is determined that the SDA is not processed, step 1104 may be performed. At step 1104, an i-th bit in the main bitmap 710 of FIGS. 7A and 7B may be set. At step 1106, the content of the i-th SDA element may be inserted to the array of bases. At step 1108, it is determined whether "Flag 4" of FIGS. 10A and 10B is set in the i-th SDA element. When it is determined that "Flag 4" is set in the i-th SDA element, step 1110 may be performed. Otherwise, step 1112 may be performed. At step 1110, SPrelation may be set as "d-diff". At step 1112, SPrelation may be set as "equality".

At step 1114, it is determined whether SDA elements with indices i and (i+1) are in SPrelation. When it is determined that SDA elements with indices i and (i+1) are in SPrelation, steps 1120 and 1122 may be performed. Otherwise, steps 1116 and 1118 may be performed.

At step 1116, "0" may be inserted to the auxiliary bitmap 730 of FIGS. 7A and 7B. At step 1118, the index i may be increased.

At step 1120, "1" may be inserted to the auxiliary bitmap 730. At step 1122, the content of i-th SDA elements may be put to SPcontent.

Note that if the searching process has finished successfully, the values of variables (i, SPrelation and SPcontent) at this searching process must be used for the compression process.

Figure 12:
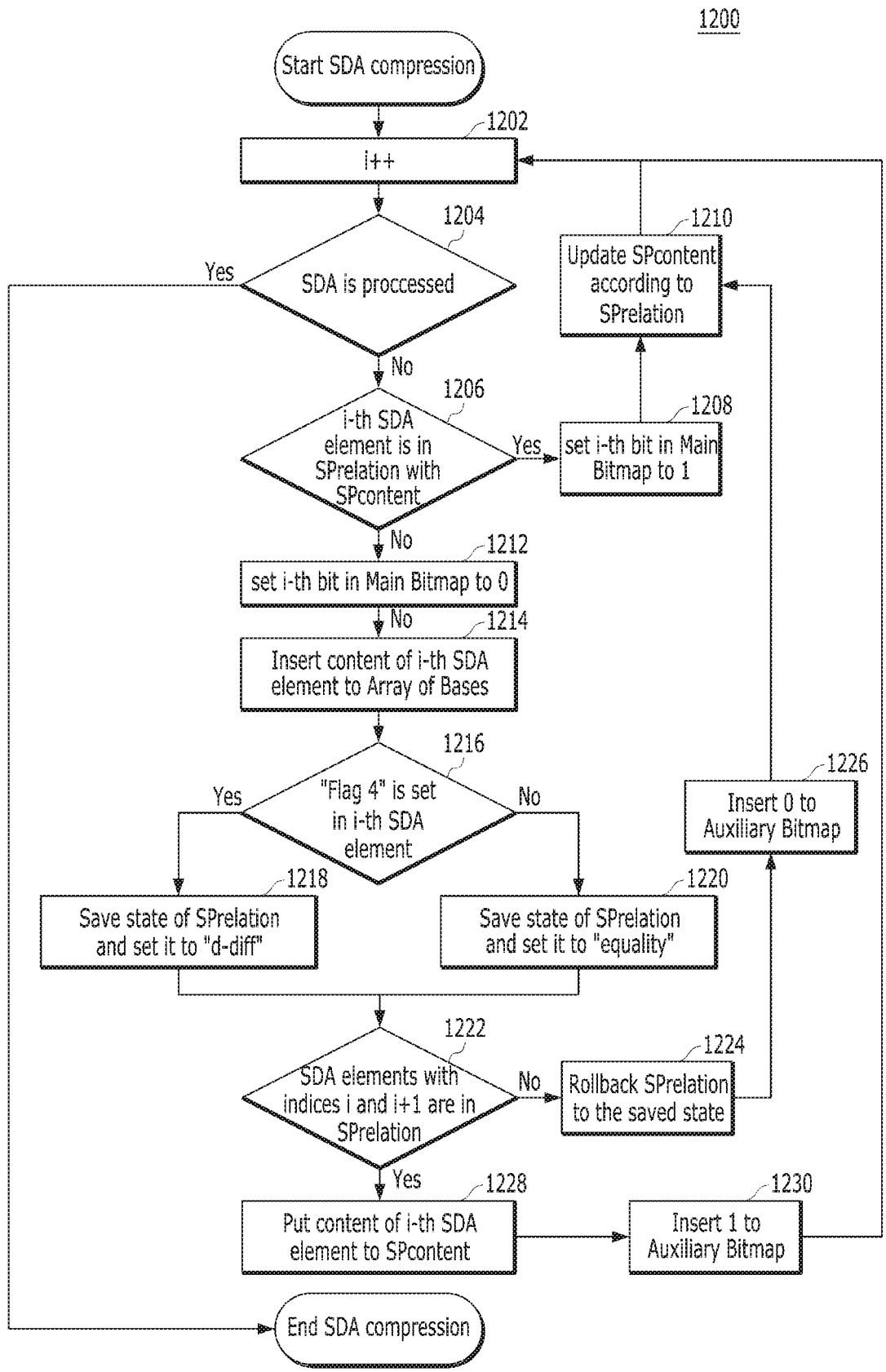
FIG. 12 is a flowchart illustrating a compression process of system data in accordance with an embodiment of the present invention.

FIG. 12 is a flowchart illustrating a compression process 1200 of system data in accordance with an embodiment of the present invention The compression process 1200 may be performed by the compression component 516 of the compression component 510 FIG. 6.

Referring to FIG. 12, at step 1204, it is determined whether an array of system data (SDA) is processed. When it is determined that the SDA is not processed, step 1206 may be performed. At step 1206, it is determined whether the i-th SDA element may have a relation with SPcontent by SPrelation. When it is determined that the i-th SDA element may have a relation with SPcontent by SPrelation, steps 1208, 1210 and 1202 may be performed. Otherwise, steps 1212 and 1214 may be performed.

At step 1208, an i-th bit in the main bitmap 710 of FIGS. 7A and 7B may be set as "1". At step 1210, the SPcontent may be updated according to SPrelation.

At step 1212, the i-th bit in the main bitmap 710 may be set as "0", At step 1214, the content of i-th SDA element may be inserted to the array of bases.

At step 1216, it is determined whether "Flag 4" of FIGS. 14A and 15A is set in the i-th SDA element. When it is determined that "Flag 4" is set in the i-th SDA element, step 1218 may be performed. Otherwise, step 1220 may be performed. At step 1218, the state of SPrelation may be saved and set to "d-diff". At step 1220, the state of SPrelation may be saved and set to "equality".

At step 1222, it is determined whether SDA elements with indices i and (i+1) are in SPrelation. When it is determined that SDA elements with indices i and (i+1) are in SPrelation, steps 1228, 1230 and 1202 may be performed sequentially. Otherwise, steps 1224, 1226, 1210 and 1202 may be performed sequentially.

At step 1224, SPrelation may be rollbacked to the saved state. At step 1226, "0" may be inserted to the auxiliary bitmap 730 of FIGS. 7A and 7B. At step 1228, the content of i-th SDA elements may be put to SPcontent. At step 1230, "1" may be inserted to the auxiliary bitmap 730. At step 1202, the index i may be increased.

Figure 13:
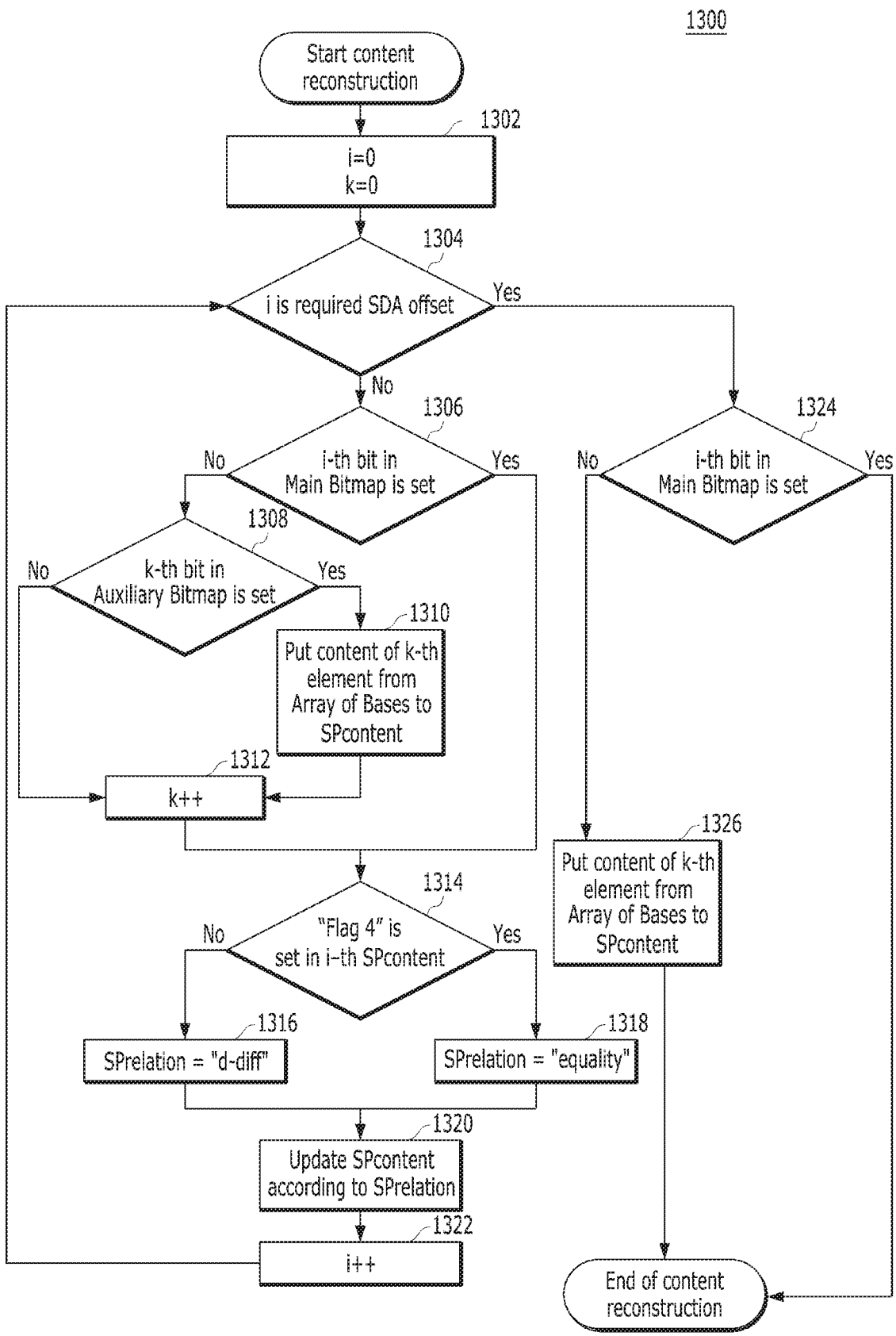
FIG. 13 is a flowchart illustrating a reconstruction process of system data in accordance with an embodiment of the present invention.

Periodically, at runtime, a content of an element of the compressed SDA may be requested by the FW, A content of any compressed SDA element may be easily reconstructed without full decompression using an offset of the element in initial SDA, as shown in FIG. 13. In other words, variable j is used for iteration through the array of bases and the auxiliary bitmap. After the above compression algorithm is finished, the variable SPcontent contains the content of the required SDA element. The decompression of the compressed SDA may be done in a similar way.

FIG. 13 is a flowchart illustrating a reconstruction process 1300 of system data in accordance with an embodiment of the present invention. The reconstruction process 1300 may be performed by the reconstruction component 520 of the compression component 510 FIG. 5.

Referring to FIG. 13, at step 1302, variables i and k may be initialized as "0". At step 1304, it is determined whether the variable i may be required SDA offset. When it is determined that the variable i may be required SDA offset, step 1306 may be performed. Otherwise, step 1324 may be performed.

At step 1306, it is determined whether an i-th bit in the main bitmap 710 of FIGS. 7A and 7B may be set as "1". When it is determined that the i-th bit in the main bitmap 710 may be set as "1", step 1314 may be performed. Otherwise, steps 1308 and 1312, or steps 1308, 1310 and 1312 may be performed.

At step 1308, it is determined whether an k-th bit in the auxiliary bitmap 730 of FIGS. 7A and 7B may be set as "1". At step 1310, the content of k-th SDA elements from the array of bases may be put to SPcontent. At step 1312, the index k may be increased.

At step 1314, it is determined whether "Flag 4" of FIGS. 14A and 15A is set in the i-th SPcontent. When it is determined that "Flag 4" is set in the i-th SPcontent, steps 1316 and 1320 may be performed. Otherwise, steps 1318 and 1320 may be performed. At step 1316, the state of SPrelation may be set to "d-diff". At step 1318, the state of SPrelation may be set to "equality".

At step 1320, SPcontent may be updated according to SPrelation. After performing step 1320, step 1322 may be performed and then step 1304 may be performed. At step 1322, the index i may be increased.

At step 1324, it is determined that an i-th bit in the main bitmap 710 may be set as "1". When it is determined that the i-th bit in the main bitmap 710 may be set as "1", the reconstruction process 1300 may be ended. Otherwise, at step 1326, the content of k-th SDA elements from the array of bases may be put to SPcontent.

In various embodiments, the compression scheme may be used to compress logical-to-physical address translation table (L2P) in mobile NAND flash-based storage devices. In this case, an array of system data (SDA) may be a segment of the L2P table. Due to limited RAM resources in mobile products, firmware (FW) has to periodically load segments of L2P from a memory device to cache, for example, from the memory device 200 to the storage 110 in FIG. 5. The FW may be running on the control component 120 of FIGS. 4A, 4B and 5.

Any L2P entry is a complex binary data structure with specified bit fields. For example, the size of L2P entry may be 16 bits, as shown in FIG. 14A.

Referring to FIG. 14A, if "Valid Bit" is set, during processing of L2P entry, the FW interprets bits from 0 to 11 as a physical address corresponding to a logical block address (LBA). For the behavior of the host system 5 in FIG. 4A or 4B, a typical pattern may be described as: write some range of LBAs sequentially and rewrite some LBAs from the range randomly. It is assumed that the size of L2P segment is 16 entries, a content of each entry is represented in HEX format, the FW uses the 3rd Super Block for sequential write and the 4th Super Block for random writes. The states of L2P elements for this workload are shown in FIGS. 14B and 14C.

FIG. 14B is a diagram illustrating an example of a complex data structure of an array of system data, for example, L2P segment.

Referring to FIG. 14B, the L2P segment may include 16 elements corresponding to LBAs. Some range of LBAs sequentially are written. Thus, contents of 16 elements have values ranging from "0x1300" to "0x130F".

After the sequential write, all elements of L2P segment contain sequential values and the difference between two neighbor entries is equal to 1. Hence, after the sequential write, elements of the L2P segment form delta value pattern (IVP) with BP=0x1300. In other words, the relation between elements is "1-diff", FIG. 14C is a diagram illustrating an example of a complex data structure of an array of system data, for example, L2P segment.

Referring to FIG. 14C, the L2P segment may include 16 elements corresponding to LBAs, Some LBAs (e.g., indices 3 and 4) of the range from "0x1300" to "0x130F" are rewritten randomly. When the host system 5 of FIG. 4A or 4B randomly rewrites some LBAs from the L2P segment (e.g., indices 3 and 4), the initial delta value pattern is split into 2 parts: a first part has indices ranging from 0 to 2, and a second part has indices ranging from 5 to 15.

Referring back to FIG. 4A or 4B, after processing L2P segments shown in FIGS. 14A to 14C, the host system 5 may send trim commands for some LBAs of FIG. 14C. During processing of these commands, as shown in FIG. 15A, the control component 120 (i.e., FW) may set "Valid Bit" to zero for trimmed LBAs and write the value of the super block erase counter value into a predefined bit field (e.g., bits from 0 to 7). FIG. 15A represents how the FW interprets L2P elements of trimmed LBAs.

FIG. 15B illustrates a complex data structure of an array of system data, for example, the structure of L2P segment after processing trim commands.

Referring to FIG. 15B, the host system of FIG. 4A or 4B ends trim commands for LBAs with indices 9 and 10. Since these LBAs have been written to the same super block, the erase counter values will be also the same, e.g., the value of index 7.

As can be seen, these trim commands are splitting the DVP with BP=0x1305 and L=11 (i.e., indices from 5 to 15). Moreover, L2P entries with indices 9 and 10 form SVP with BP=0x0307 and L=2. The relation between elements 9 and 10 is equality.

FIG. 15C is a diagram illustrating an example of compressed system data in accordance with an embodiment of the present invention For example, FIG. 15C illustrates that the L2P segment of FIG. 15B is compressed.

Referring to FIG. 15C, the compressed L2P segment may include main bitmap including 16 bits "0110011110101111" and corresponding main bitmap indices ranging from 0 to 15. Further, the compressed L2P segment may include information of array of bases, which includes 5 values of BP"0x1300", "0x14F1", "0x1409", "0x0307", and "0x130B". Furthermore, the compressed L2P segment may include auxiliary bitmap including 5 bits "10011" and corresponding array of bases and auxiliary bitmap indices ranging from 0 to 4. Values of information included the compressed L2P segment of FIG. 15C may be determined similarly by the compression scheme in FIGS. 9A and 9B.

Referring back to FIG. 5, the control component 120 (i.e., FW) may require the content of L2P segment with index 10, as shown in FIG. 15B. The control component 120 may reconstruct data from the compressed data, as shown in FIG. 15C. According to the reconstruction process of FIG. 13, the reconstruction component 520 may read 11 bits of the main bitmap corresponding to main bitmap indices 0 to 10, Therefore, the total number of iterations may be 11 as the List 2 to List 14 below. The variables used for the iteration through bitmaps during reconstruction are i and k. Variable i represents main bitmap and variable k represents auxiliary bitmap. The values of variables on each iteration and the sequence of actions are described as the following List 2 to List 14:

List 2:

[Iteration 1] Values of variables i = 0, k = 0, SPrelation and SPContent are undefined:
algorithm reads bit i = 0 of the Main Bitmap, which is 0, hence
algorithm reads bit k = 0 in the Auxiliary Bitmap which is 1, hence
content Array of Bases element with index k = 0 should be put to variable SPcontent (SPcontent = 0x1300), and k should be incremented
"Valid Bit" is set in SPcontent, so SPrelation is "1-diff", hence SPcontent should be incremented (SPcontent = 0x1301)
Increment i and go to the next iteration List 3:

[Iteration 2] Values of variables i = 1, k = 1, SPrelation = "1-diff" and SPContent = 0x1301:
algorithm reads bit i = 1 of the Main Bitmap, which is 1, hence
algorithm should only update SPcontent according to value SPrelation, which is "1-diff". Therefore, algorithm increases SPcontent (SPcontent = 0x1302)
increment i and go to the next iteration List 4:

[Iteration 3] Values of variables i = 2, k = 1, SPrelation = "1-diff" and SPContent = 0x1302:
algorithm reads bit i = 2 of the Main Bitmap, which is 1, hence
algorithm should only update SPcontent according to value SPrelation, which is "1-diff". Therefore, algorithm increases SPcontent (SPcontent = 0x1303)
increment i and go to the next iteration List 5:

[Iteration 4] Values of variables i = 3, k = 1, SPrelation = "1-diff" and SPContent = 0x1303:
algorithm reads bit i = 3 of the Main Bitmap, which is 0, hence
algorithm reads bit k = 1 in the Auxiliary Bitmap which is 0, hence
algorithm should increment k and update SPcontent according to value SPrelation, which is "1-diff". Therefore, algorithm increases SPcontent (SPcontent = 0x1304)
increment i and go to the next iteration List 6:

[Iteration 5] Values of variables i = 4, k = 2, SPrelation = "1-diff" and SPContent = 0x1304:
algorithm reads bit i = 4 of the Main Bitmap, which is 0, hence
algorithm reads bit k = 2 in the Auxiliary Bitmap which is 0, hence
algorithm should increment k and update SPcontent according to value SPrelation, which is "1-diff". Therefore, algorithm increases SPcontent (SPcontent = 0x1305)

List 7:

[Iteration 6] Values of variables i = 5, k = 3, SPrelation = "1-diff" and SPContent = 0x1305:
actions are the same as in the second iteration List 8:

[Iteration 7] Values of variables i = 6, k = 3, SPrelation = "1-diff" and SPContent = 0x1306:
actions are the same as in the second iteration List 9:

[Iteration 8] Values of variables i = 7, k = 3, SPrelation = "1-diff" and SPContent = 0x1307:
actions are the same as in the second iteration List 10:

[Iteration 9] Values of variables i = 8, k = 3, SPrelation = "1-diff" and SPContent = 0x1308:
actions are the same as in the second iteration List 11:

[Iteration 10] Values of variables i = 9, k = 3, SPrelation = "1-diff" and SPContent = 0x1309:
algorithm reads bit i = 9 of the Main Bitmap, which is 0, hence
algorithm reads bit k = 3 in the Auxiliary Bitmap which is 1, hence
content Array of Bases element with index k = 3 should be put to variable SPcontent (SPcontent = 0x0307), and j should be incremented
"Valid Bit" is not set in SPcontent, so SPrelation is "equality", hence SPcontent is not changed (SPcontent = 0x0307)
increment i and go to the next iteration List 12:

[Iteration 11] Values of variables i = 10, k = 4, SPrelation = "equality" and SPContent = 0x0307:
value of variable i is equal to the required offset, hence
algorithm reads bit i = 10 of the Main Bitmap, which is 1, hence
SPcontent is not changed (SPcontent = 0x0307)
algorithm stops In the List 2 to List 12 above, the element content "0x1300" of FIGS. 15B and 15C may be reconstructed by the iteration of the List 2. The element content "0x1301" of FIGS. 15B and 15C may be reconstructed by the iteration of the List 3, and the element content "0x302" of FIGS. 15B and 15C may be reconstructed by the iteration of the List 4. The element content "0x14F1" of FIG. 15B and 15C may be reconstructed by the iteration of the List 5 and reading the element from array of bases with index according to value of variable k, and the element content "0x1409" of FIGS. 15B and 15C may be reconstructed by the iteration of the List 6 and reading the element from array of bases with index according to value of variable k. The element content "0x0307" of FIGS. 15B and 15C may be reconstructed by the iteration of the List 12.

When the reconstruction algorithm above is finished, variable SPrelation=0x0305 contains the content of required offset in the LBA segment. The content of any L2P segment entry may be reconstructed with the help of this algorithm.

A detailed description above is provided for an illustrative and descriptive purpose. It is not intended to limit the invention to a precise form. Modifications of parameters of the compression algorithm are possible to meet the specific requirements. For example, to improve the compression ratio, additional compression of the array of bases may be added, if there is a known relation between the BPs of the observed patterns in the array of system data (SDA). Alternatively, compression of the main bitmap may be taken into account, if entire SDAs contain non-split pattern with single BP as shown in FIG. 16A.

FIG. 16A is a diagram illustrating an example of a complex data structure of an array of system data, for example, the structure of L2P segment including only one pattern. FIG. 16B is a diagram illustrating an example of compressed system data in accordance with an embodiment of the present invention. For example, FIG. 16B illustrates that the L2P segment of FIG. 16A is compressed.

Referring to FIG. 16A, the L2P segment may include non-split pattern with single BP (i.e., "0x1000"). In other words, neighbor elements, which are adjacent two elements among element with index 0 to element with index 15 have a linear relation.

Referring to FIG. 16B, the compressed L2P segment may include main bitmap including 16 bits 0111111111111111" and corresponding main bitmap indices ranging from 0 to 15. Further, the compressed L2P segment may include information of array of bases, which includes only one value of BP "0x1000", Furthermore, the compressed L2P segment may include auxiliary bitmap including 1 bit "1" and corresponding array of bases and auxiliary bitmap index 0.

As can be seen from FIG. 16B, if SDA contains only one pattern, all bits of the main bitmap are equal to 1, except the first bit, which always equals 0, because the first SDA element is BP. In other words, the first bit of the main bitmap equals 0, and all other bits of the main bitmap equal 1. This allows reducing the size of main bitmap to 1 bit. The content of any SDA element may be reconstructed by using its index and BP stored in array of bases.

As the foregoing describes, embodiments of the present invention provide an adjustable compression scheme for system data of memory systems such as NAND flash-based storage devices may be provided. The compression scheme may take into account the variable difference between compressed data elements. The compression scheme may reduce of the number of internal firmware (FW) accesses to flash chips by reducing the size of system data and allows entire system performance boosting.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims.

What is claimed is:

1. A memory system comprising:
   a memory device; and
   a memory controller including a compression component suitable for identifying one or more patterns in an array of system data including a plurality of elements and compressing the array of system data based on the identified one or more patterns, the plurality of elements including neighbor elements and at least one other element interposed between two adjacent elements among the neighbor elements, the one or more patterns including a first pattern and a second pattern, the first pattern indicating that the neighbor elements have a first content, the second pattern indicating that the other element has a second content different from the first content, wherein each of the first and second patterns are compressed separately, and
   wherein the memory controller controls the memory device to store the compressed system data in the memory device,
   wherein the array of system data includes the neighbor elements corresponding to the first pattern, among the plurality of elements, and
   wherein the compressed system data includes:
   first information including a first bit indicating the first content; and
   second information including a first bitmap, each bit of the first bitmap indicating whether a corresponding element is a first element among the neighbor elements of the first pattern.

2. The memory system of claim 1, wherein all of the neighbor elements have the first content equally.

3. The memory system of claim 1, wherein a first element of the neighbor elements has the first content and a second element of the neighbor elements has a second content different from that of the first content, the second element adjacent to the first element.

4. The memory system of claim 1, wherein the compressed system data further includes:
   third information including a second bitmap, a first bit of the second bitmap indicating a length of the first pattern.

5. The memory system of claim 4, wherein the array of system data includes the other element having the second pattern, the other element having the second content different from the first content, the other element interposed between two adjacent elements among the neighbor elements,
   wherein the first information further includes a second bit indicating the second content, and
   wherein a second bit of the second bitmap indicates a length of the second pattern.

6. A memory system comprising:
   a memory device suitable for storing compressed system data including first and second information; and
   a memory controller suitable for loading the compressed system data, and reconstructing the loaded compressed system data based on the first and second information to generate an array of system data,
   wherein the array of system data includes neighbor elements corresponding to a first pattern and at least one other element interposed between two adjacent elements among the neighbor elements, the first pattern indicating that the neighbor elements have a first content, the second pattern indicating that the other element has a second content different from the first content, wherein each of the first and second patterns are compressed separately,
   wherein the first information includes a first bit indicating the first content, and
   wherein the second information includes a first bitmap, each bit of the first bitmap indicating whether a corresponding element is a first element among the neighbor elements of the first pattern.

7. The memory system of claim 6, wherein all of the neighbor elements have the first content equally.

8. The memory system of claim 6, wherein a first element of the neighbor elements has the first content and a second element of the neighbor elements has a second content different from that of the first content, the second element adjacent to the first element.

9. The memory system of claim 6, wherein the compressed system data further includes:
third information including a second bitmap, a first bit of the second bitmap indicating a length of the first pattern.

10. The memory system of claim 9, wherein the array of system data includes the other element having the second pattern, the other element having the second content different from the first content, the other element interposed between two adjacent elements among the neighbor elements,
wherein the first information further includes a second bit indicating the second content, and
wherein a second bit of the second bitmap indicates a length of the second pattern.

11. A method for operating a memory system including a memory device and a memory controller, the method comprising:
identifying one or more patterns of an array of system data including a plurality of elements, the plurality of elements including neighbor elements and at least one other element interposed between two adjacent elements among the neighbor elements, the one or more patterns including a first pattern and a second pattern, the first pattern indicating that the neighbor elements have a first content, the second pattern indicating that the other element has a second content different from the first content;
compressing the array of system data based on the identified one or more patterns, each of the first and second patterns being compressed separately; and
storing the compressed system data in the memory device,
wherein the array of system data includes the neighbor elements corresponding to the first pattern, among the plurality of elements, and
wherein the compressed system data includes:
first information including a first bit indicating the first content; and
second information including a first bitmap, each bit of the first bitmap indicating whether a corresponding element is a first element among the neighbor elements of the first pattern.

12. The method of claim 11, wherein all of the neighbor elements have the first content equally.

13. The method of claim 11, wherein a first element of the neighbor elements has the first content and a second element of the neighbor elements has a second content different from that of the first content, the second element adjacent to the first element.

14. The method of claim 11, wherein the compressed system data further includes:
third information including a second bitmap, a first bit of the second bitmap indicating a length of the first pattern.

15. The method of claim 14, wherein the array of system data includes the other element having the second pattern, the other element having the second content different from the first content, the other element interposed between two adjacent elements among the neighbor elements,
wherein the first information further includes a second bit indicating the second content, and
wherein a second bit of the second bitmap indicates a length of the second pattern.

16. A method for operating a memory system including a memory device and a memory controller, the method comprising:
loading compressed system data including first and second information from a memory device; and
reconstructing the loaded compressed system data based on the first and second information to generate an array of system data,
wherein the array of system data includes neighbor elements corresponding to a first pattern and at least one other element interposed between two adjacent elements among the neighbor elements, the first pattern indicating that the neighbor elements have a first content, the second pattern indicating that the other element has a second content different from the first content, wherein each of the first and second patterns are compressed separately,
wherein the first information includes a first bit indicating the first content, and
wherein the second information includes a first bitmap, each bit of the first bitmap indicating whether a corresponding element is a first element among the neighbor elements of the first pattern.

17. The method of claim 16, wherein all of the neighbor elements have the first content equally.

18. The method of claim 16, wherein a first element of the neighbor elements has the first content and a second element of the neighbor elements has a second content different from that of the first content, the second element adjacent to the first element.

19. The method of claim 16, wherein the compressed system data further includes:
third information including a second bitmap, a first bit of the second bitmap indicating a length of the first pattern.

20. The method of claim 19, wherein the array of system data includes the other element having the second pattern, the other element having the second content different from the first content, the other element interposed between two adjacent elements among the neighbor elements,
wherein the first information further includes a second bit indicating the second content, and
wherein a second bit of the second bitmap indicates a length of the second pattern.

* * * * *